United States Patent
Cai et al.

(10) Patent No.: US 9,059,195 B2
(45) Date of Patent: *Jun. 16, 2015

(54) LATERAL BIPOLAR TRANSISTORS HAVING PARTIALLY-DEPLETED INTRINSIC BASE

(71) Applicant: International Business Machines Corporation, Armonk, NY (US)

(72) Inventors: Jin Cai, Cortlandt Manor, NY (US); Tak H. Ning, Yorktown Heights, NY (US); Ghavam G. Shahidi, Pound Ridge, NY (US); Jeng-Bang Yau, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 84 days.

This patent is subject to a terminal disclaimer.

(21) Appl. No.: 13/904,384

(22) Filed: May 29, 2013

(65) Prior Publication Data

US 2014/0353726 A1    Dec. 4, 2014

(51) Int. Cl.
| | |
|---|---|
| *H01L 29/08* | (2006.01) |
| *H01L 29/10* | (2006.01) |
| *H01L 29/735* | (2006.01) |
| *H01L 29/66* | (2006.01) |
| *H01L 29/737* | (2006.01) |
| *H01L 21/22* | (2006.01) |
| *H01L 21/762* | (2006.01) |

(52) U.S. Cl.
CPC ........ *H01L 29/66242* (2013.01); *H01L 29/737* (2013.01); *H01L 21/22* (2013.01); *H01L 21/76267* (2013.01); *H01L 29/6625* (2013.01)

(58) Field of Classification Search
CPC .............. H01L 29/0821; H01L 29/66242; H01L 29/66318; H01L 29/7317; H01L 29/1004; H01L 29/1095; H01L 27/1203
USPC .......... 257/197, 557, 565, E29.033, E29.045, 257/E29.187, E21.372
See application file for complete search history.

(56) References Cited

U.S. PATENT DOCUMENTS

| | | | |
|---|---|---|---|
| 5,298,786 A | 3/1994 | Shahidi et al. | 257/559 |
| 5,446,312 A | 8/1995 | Hsieh et al. | 257/559 |
| 7,170,112 B2 | 1/2007 | Ning | 257/197 |
| 7,285,454 B1 | 10/2007 | Liang et al. | 438/202 |
| 7,671,447 B2 | 3/2010 | Montree et al. | 257/565 |
| 8,022,506 B2 | 9/2011 | Ludikhuize | 257/592 |
| 2002/0089038 A1* | 7/2002 | Ning | 257/574 |
| 2004/0084692 A1* | 5/2004 | Ning | 257/197 |
| 2005/0087805 A1* | 4/2005 | Ning | 257/350 |
| 2011/0266630 A1 | 11/2011 | Suligoj et al. | 257/370 |
| 2012/0235151 A1 | 9/2012 | Cai | 257/65 |

* cited by examiner

*Primary Examiner* — Victor A Mandala
(74) *Attorney, Agent, or Firm* — Ido Tuchman; Louis J. Percello

(57) ABSTRACT

A bipolar junction transistor (BJT) and method for fabricating such. The transistor includes an emitter region, a collector region, and an intrinsic-base region. The intrinsic-base region is positioned between the emitter region and the collector region. Furthermore, the physical separation between the emitter region and the collector region is less than the sum of a base-emitter space-charge region width and a base-collector space-charge region width at the transistor's standby mode.

10 Claims, 3 Drawing Sheets

LATERAL BIPOLAR TRANSISTORS HAVING PARTIALLY-DEPLETED INTRINSIC BASE

BACKGROUND

The present invention relates to transistor design, and more particularly, to a novel bipolar junction transistor (BJT) on silicon on oxide (SOI).

A bipolar junction transistor is a three terminal electronic device commonly used in amplifying or switching applications. BJTs can be used both for high-power switch applications such as switched mode power supplies and for low-power switch applications such as logic gates. BJTs are also commonly used in vast numbers of products as amplifiers to provide current gain, voltage gain or sometimes both. From mobile phones to televisions, BJTs are used to provide sound reproduction, radio transmission, and signal processing.

A BJT is generally constructed of doped semiconductor material and its operation involves both electron and hole migration. A BJT can operate under different types of operation modes such as forward and reverse active mode, standby mode, cutoff and saturation mode depending on the biasing voltage applied.

Conventional bipolar transistors have a quasi-neutral base region of width $W_B$. In a conventional NPN bipolar junction transistor (BJT), for example, the physical separation $W_{E-C}$ between the n+ emitter and n+ collector consists of three regions: the quasineutral intrinsic base of width $W_B$, the base-emitter space-charge region of width $W_{dBE}$, and the base-collector space-charge region of width $W_{dBC}$. The relation between these regions is dictated by $W_{B-C} = W_B + W_{dBE} + W_{dBC}$.

During operation, $W_B$ is modulated by the bias voltages $V_{BE}$ and $V_{BC}$, with $W_B$ typically remaining non-zero all the time. The collector current is controlled by the value of $W_B$. Specifically, the collector current is inversely proportional to $W_B$, and it varies with the applied emitter-base diode voltage $V_{BE}$ as $\exp(qV_{BE}/kT)$. That is, the collector current varies in the form $IC_0 \times \exp(qV_{BE}/kT)$ where $IC_0$ is more-or-less independent of $V_{BE}$. At large $V_{BE}$, the collector current can be quite large. At a small $V_{BE}$, or at zero $V_{BE}$, the collector current is extremely low, limited only by the collector-base diode background leakage current.

For low-voltage bipolar circuits, such as I²L (Integrated Injection Logic) and CBipolar (Complementary Bipolar, which is analogous to CMOS), achieving high switching speed typically requires the transistors to switch about equally fast in both forward-active mode (emitter-base forward biased) and in reverse-active mode (collector-base forward biased). The complementary SOI lateral bipolar transistors are ideal for low-voltage bipolar circuits. They switch equally fast in forward-active and reverse-active modes.

BRIEF SUMMARY

Accordingly, one example aspect of the present invention is a bipolar junction transistor (BJT). The transistor includes an emitter region, a collector region, and an intrinsic-base region. The intrinsic-base region is positioned between the emitter region and the collector region. Furthermore, the physical separation between the emitter region and the collector region is less than the sum of a base-emitter space-charge region width and a base-collector space-charge region width at the transistor's standby mode.

Another example aspect of the present invention is a method for fabricating a bipolar junction transistor (BJT). The method includes a doping operation to dope an intrinsic-base region positioned between an emitter region and a collector region. Another doping operation dopes the emitter region and the collector region. Again, the physical separation between the emitter region and the collector region is less than the sum of a base-emitter space-charge region width and a base-collector space-charge region width at the transistor's standby mode.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

Figure 1:
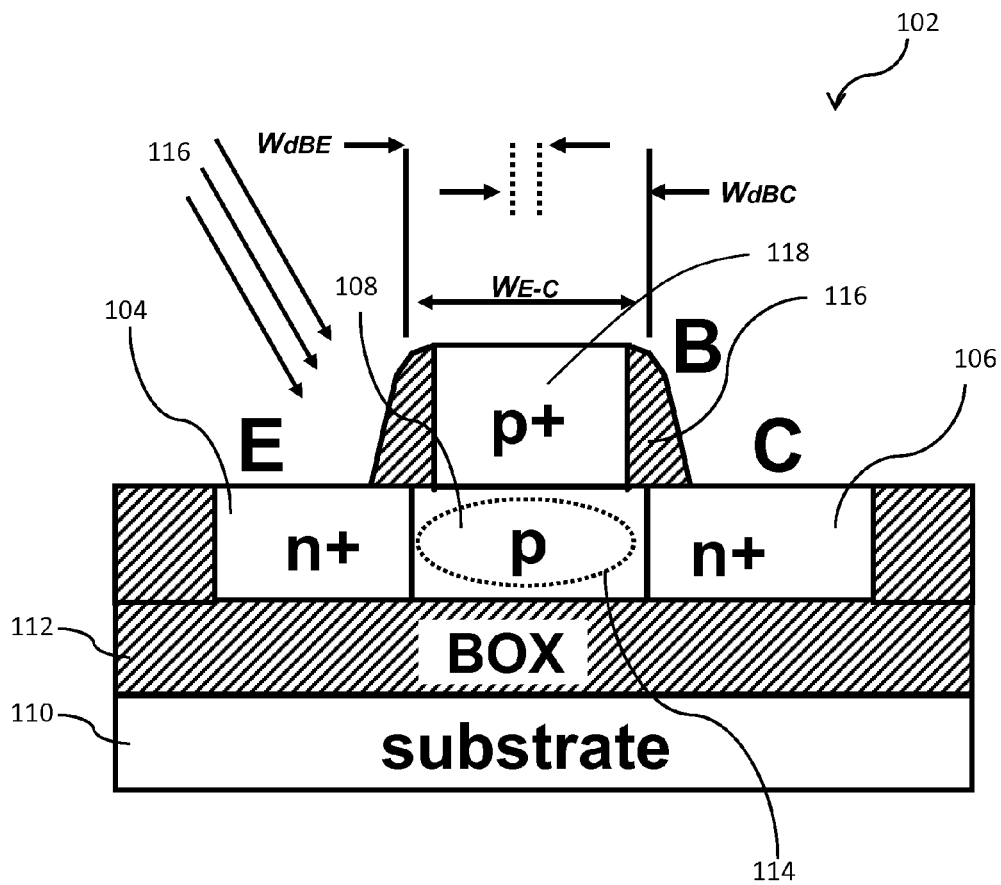
FIG. 1 shows an example lateral NPN bipolar junction transistor (BJT) in accordance with the present invention.

The present invention is described with reference to embodiments of the invention. Throughout the description of the invention reference is made to FIGS. 1-3. When referring to the figures, like structures and elements shown throughout are indicated with like reference numerals.

Embodiments of the present invention include a design of the base region of a bipolar transistor, resulting in significantly larger collector current than the collector current in conventional bipolar transistors. Specifically, the novel high-current device is a lateral bipolar transistor on SOI.

FIG. 1 illustrates an example lateral NPN bipolar junction transistor (BJT) 102 in accordance with the present invention. The transistor 102 includes an emitter region 104, a collector region 106, an intrinsic-base region 108 and an extrinsic-base region 118. As shown, the intrinsic-base region 108 positioned between the emitter region 104 and the collector region 106. Furthermore, the physical separation between the emitter region and the collector region $W_{E-C}$ is less than the sum of a base-emitter space-charge region width $W_{dBE}$ and a base-collector space-charge region width $W_{dBC}$ at a transistor standby mode. Thus, the base-emitter space-charge region $W_{dBE}$ and the base-collector space-charge region $W_{dBC}$ overlap while the transistor is in the standby mode. As used herein, "standby mode" refers to a condition where $V_{BE}$ is zero volts.

In a particular embodiment, a semiconductor substrate 110 carrying the transistor 102 is electrically isolated from the intrinsic-base region 108. For example, a buried oxide layer 112 may be positioned between the semiconductor substrate 110 and the intrinsic-base region 108, the emitter region 104, and the collector region 106.

In one embodiment, the intrinsic-base region 108 includes a partially depleted intrinsic-base region 114 such that there is no quasineutral intrinsic-base region when the BJT 102 is biased at the transistor standby mode. For example, the intrinsic-base region 108 may be doped to an intrinsic-base region doping level such that the base-emitter space-charge region width $W_{dBE}$ at the transistor standby mode is equal to $\sqrt{2\in_{si}\psi_{bi}/qN_B}$, where $\in_{si}$ is a dielectric constant of Si, $\psi_{bi}$ is a built-in potential of a P-N junction, q is a electric change constant, and $N_B$ is the intrinsic-base region doping level, the base-collector space-charge region width $W_{dBC}$ at the transistor standby mode is equal to where $\sqrt{2\epsilon_{si}(\psi_{bi}-V_{BC})/qN_B}$, where $V_{BC}$ is the base-collector diode voltage at the transistor standby mode, and the physical separation $W_{E-C}$ between the emitter region and the collector region is less than the sum of $W_{dBE}$ and $W_{dBC}$.

In a particular configuration, the emitter region doping and collector region doping may be performed by implanting a dopant 116 at an angle after sidewall spacers 116 are formed proximate the extrinsic-base region 118. For example, the angled implant may be performed at 20° to 50° tilt angle. Furthermore, the emitter region doping and collector region doping may be performed before sidewall spacers 116 are formed proximate the extrinsic-base region 118.

As will be appreciated by one of skill in the art, the transistor 102 may a NPN or a PNP transistor. That is, the emitter region 104 and the collector region 106 include an N+ dopant, and the intrinsic-base region 108 includes a P dopant, or the emitter region 104 and the collector region 106 include a P+ dopant, and the intrinsic-base region 108 includes an N dopant. Furthermore, the intrinsic-base region 108 may include a homojunction or a heterojunction. In one embodiment, the heterojunction may be formed with a SiGe alloy material at the intrinsic-base region 108 and Si material at the emitter region 104.

Figure 2:
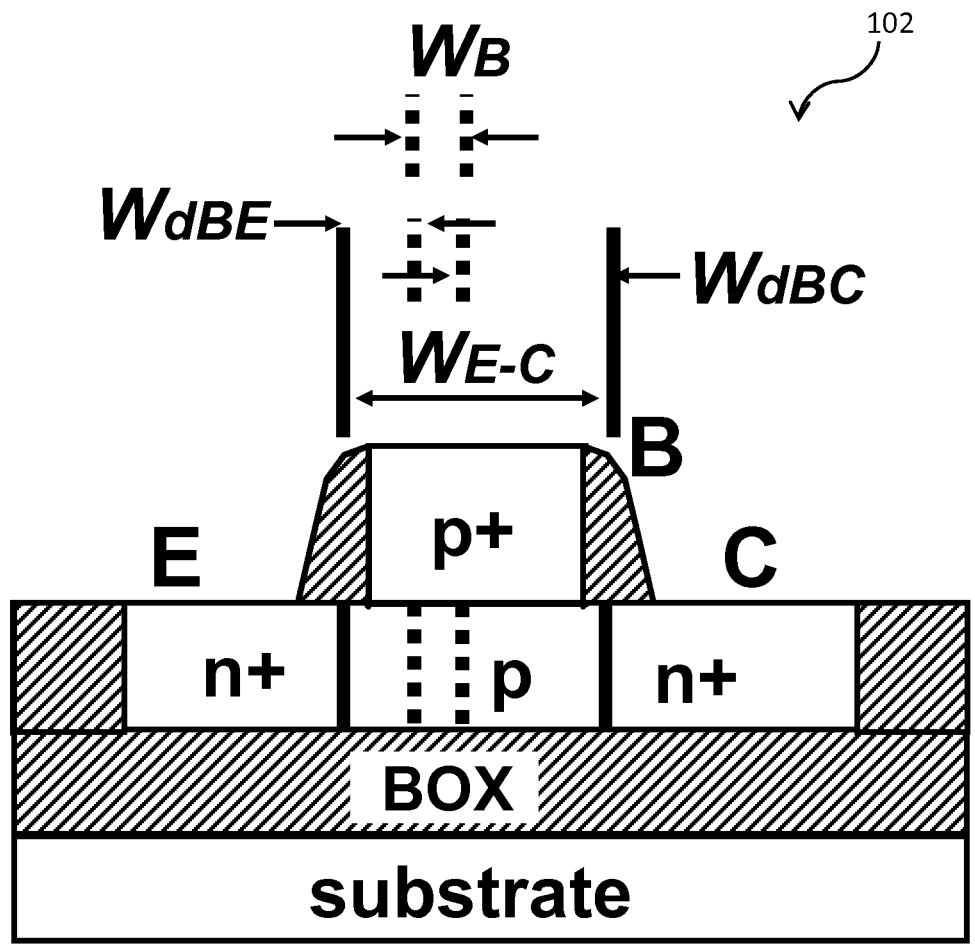
FIG. 2 show the example lateral NPN bipolar junction transistor turned on, in accordance with the present invention.

FIG. 2 show the example lateral NPN bipolar junction transistor (BJT) 102 turned on, in accordance with the present invention. As the transistor 102 is turned on with an applied $V_{BE}$ near $V_{CC}$, the BE diode and the BC diode space-charge regions shrinks. As shown, at a relatively large $V_{BE}$ value, the width $W_B$ of the quasineutral base region becomes finite but small. Thus, there is a small quasineutral $W_B$.

The collector current at small $V_{BE}$, before $W_B$ becomes non-zero, is controlled by the depleted base region barrier height. The collector current is much larger than that of a conventional bipolar transistor having a finite $W_B$ value at all times during operation. The larger current results in a faster transistor. The collector current at large $V_{BE}$, where $W_B$ is finite, is controlled by $W_B$ just like in a conventional transistor. As mentioned above, the advantages of the transistor 102 can be applied to both NPN and PNP, as well as both homojunction and heterojunction device structures.

Accordingly, the SOI lateral bipolar transistor has an intrinsic-base region where the base doping concentration and the physical separation $W_{E-C}$ between the heavily doped emitter and collector regions are such that the sum of the emitter-base diode space-charge-region width $W_{dBE}$ and the collector-base diode space-charge-region width $W_{dBC}$ is larger than $W_{E-C}$. That is, in standby mode, $(W_{dBE}+W_{dBC})>W_{E-C}$ for the SOI lateral bipolar transistor. In other words, the intrinsic-base region is depleted in standby mode.

In operation, as the transistor 102 is turned on by the voltage $V_{BE}$ applied to the emitter-base diode, and both $W_{dBE}$ and $W_{dBC}$ shrink as $V_{BE}$ is increased. As long as the condition $(W_{dBE}+W_{dBC})>W_{E-C}$ holds, the intrinsic-base is depleted and the collector current is controlled by the energy barrier in the depleted intrinsic-base region. The collector current in the depleted-base device is much larger than the collector current in a conventional device having a quasi-neutral intrinsic base.

At some large $V_{BE}$ value, $(W_{dBE}+W_{dBC})$ becomes smaller than $W_{E-C}$, and a small but finite quasi-neutral base region of width $W_B$ appears. The value of $W_B$ is, to first order, given by the relationship $(W_{dBE}+W_{dBC}+W_B)=W_{E-C}$. Once this happens, as $V_{BE}$ is increased further, the collector current becomes controlled by the quasi-neutral thin base, and varies as $1/W_B$, as in a conventional transistor.

Figure 3:
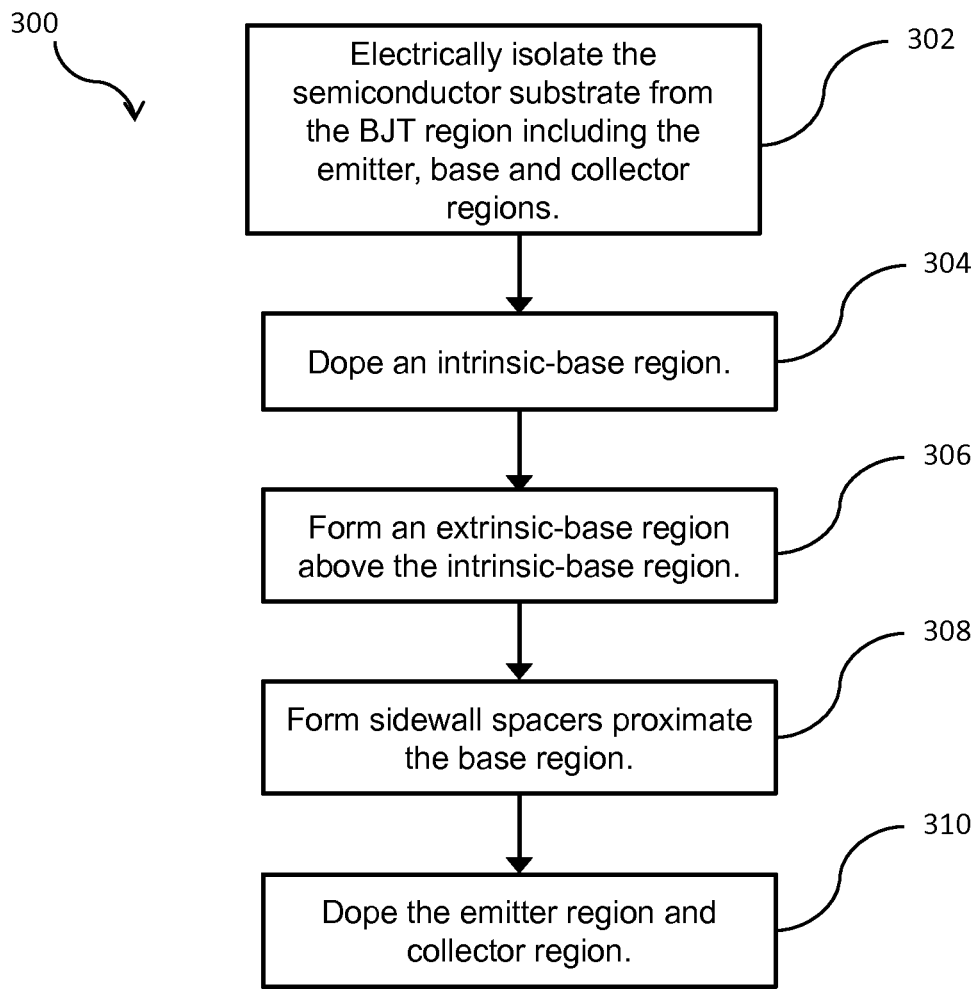
FIG. 3 shows an example method for fabricating a lateral bipolar junction transistor in accordance with the present invention.

FIG. 3 shows an example method 300 for fabricating a bipolar junction transistor in accordance with the present invention. The method includes an isolating operation 302. At isolating operation 302, the semiconductor substrate is electrically isolated from the BJT region including an emitter region, an intrinsic base region and a collector region. In a particular embodiment, isolating operation 302 includes forming a dielectric isolation between the semiconductor substrate and the BJT region. In another embodiment, isolating operation 302 includes forming a P/N junction isolation between the semiconductor substrate and the BJT region.

After isolation operation 302 is completed, the process continues to doping operation 304. During this operation, an intrinsic-base region positioned between an emitter region and a collector region is doped.

After doping operation 304 is completed, the process continues to forming operation 306. During forming operation 308, an extrinsic-base region is deposited over the intrinsic-base region. After forming operation 306 is completed, the process continues to forming operation 308.

At forming operation 308, sidewall spacers are formed proximate the extrinsic-base region. The forming operation 308 is followed by doping operation 310.

At doping operation 310, the emitter region and collector region are doped. The emitter region and collector region are doped so that a physical separation between the emitter region and the collector region is less than the sum of a base-emitter space-charge region width and a base-collector space-charge region width at a transistor standby mode. After the doping operation 310 is done, the process ends.

In one embodiment, emitter region and collector region are doped such that a physical separation between the emitter region and the collector region is less than the sum of a base-emitter space-charge region width and a base-collector space-charge region width at a transistor standby mode. In one embodiment, the intrinsic-base region is doped such that there is no quasineutral intrinsic base region when the BJT is biased at the transistor standby mode. Furthermore, doping operation 310 may include doping the intrinsic-base region to an intrinsic-base region doping level such that the base-emitter space-charge region width at the transistor standby mode is equal to $\sqrt{2\epsilon_{si}\omega_{bi}/qN_B}$, where $\epsilon_{si}$ is a dielectric constant of Si, $\omega_{bi}$ is a built-in potential of a P-N junction, q is a electric change constant, and $N_B$ is the intrinsic-base region doping level, the base-collector space-charge region width $W_{dBC}$ at the transistor standby mode is equal to $\sqrt{2\epsilon_{si}(\psi_{bi}-V_{BC})/qN_B}$, where $V_{BC}$ is the base-collector diode voltage at the transistor standby mode, and the physical separation $W_{E-C}$ between the emitter region and the collector region is less than the sum of $W_{dBE}$ and $W_{dBC}$ In one embodiment, doping operation 310 involves doping the emitter region and the collector region with P+ dopant. In another embodiment, doping operation 310 involves doping the emitter region and the collector region with N+ dopant. Various materials known to those skilled in the art may be used as dopants, such as phosphorus (P) for N-type doping and boron (B) for P-type doping. As discussed above, doping operation 310 may include implanting a dopant to the emitter region and the collector region at an angle.

In a particular embodiment, the intrinsic-base region is doped first, followed by a deposition of extrinsic base region which is more heavily doped with the same doping type as the intrinsic base. Then, a sidewall spacer is formed proximate the extrinsic base region. The emitter and collector regions are then doped by implanting a dopant with a different type than that of the base regions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A bipolar junction transistor (BJT) comprising:
   an emitter region;
   a collector region; and
   an intrinsic-base region positioned between the emitter region and the collector region, wherein a physical separation between the emitter region and the collector region is less than the sum of a base-emitter space-charge region width and a base-collector space-charge region width at a transistor standby mode.

2. The bipolar junction transistor of claim 1, wherein the base-emitter space-charge region and the base-collector space-charge region overlap at the transistor standby mode.

3. The bipolar junction transistor of claim 1, wherein the intrinsic-base region includes a partially depleted intrinsic-base region such that there is no quasineutral intrinsic-base region when the BJT is biased at the transistor standby mode.

4. The bipolar junction transistor of claim 1, further comprising a semiconductor substrate electrically isolated from the intrinsic-base region.

5. The bipolar junction transistor of claim 4, further comprising a buried oxide layer positioned between the semiconductor substrate and the intrinsic-base region, the emitter region, and the collector region.

6. The bipolar junction transistor of claim 1, wherein the emitter region and the collector region include an N+ dopant, and the intrinsic-base region includes a P dopant.

7. The bipolar junction transistor of claim 1, wherein the emitter region and the collector region include a P+ dopant, and the intrinsic-base region includes an N dopant.

8. The bipolar junction transistor of claim 1, further comprising a heterojunction between the emitter region and the intrinsic-base region.

9. The bipolar junction transistor of claim 8, the intrinsic-base region is a SiGe alloy material and the emitter region is Si material.

10. The bipolar junction transistor of claim 1, wherein the intrinsic-base region is doped to an intrinsic-base region doping level such that the base-emitter space-charge region width at the transistor standby mode is equal to $\sqrt{2\epsilon_{si}\psi_{bi}/qN_B}$, where $\epsilon_{si}$ is a dielectric constant of Si, $\psi_{bi}$ is a built-in potential of a P-N junction, q is a electric change constant, and $N_B$ is the intrinsic-base region doping level, the base-collector space-charge region width $W_{dBC}$ at the transistor standby mode is equal to $\sqrt{2\epsilon_{si}(\psi_{bi}-V_{BC})/qN_B}$, where $V_{BC}$ is the base-collector diode voltage at the transistor standby mode, and the physical separation $W_{E-C}$ between the emitter region and the collector region is less than the sum of $W_{dBE}$ and $W_{dBC}$.

* * * * *